US005752181A

United States Patent [19]

Vice

[11] Patent Number: 5,752,181
[45] Date of Patent: *May 12, 1998

[54] METHOD AND APPARATUS FOR REDUCING INERMODULATION DISTORTION IN A MIXER

[75] Inventor: Michael W. Vice, El Granada, Calif.

[73] Assignee: Watkins-Johnson Company, Palo Alto, Calif.

[*] Notice: The term of this patent shall not extend beyond the expiration date of Pat. No. 5,361,409.

[21] Appl. No.: 574,071

[22] Filed: Dec. 18, 1995

Related U.S. Application Data

[62] Division of Ser. No. 376,126, Jan. 19, 1995, Pat. No. 5,551,074, which is a continuation of Ser. No. 105,292, Aug. 10, 1993, abandoned, which is a division of Ser. No. 4,234, Jan. 14, 1993, Pat. No. 5,361,409, which is a continuation of Ser. No. 668,248, Mar. 12, 1991, abandoned.

[51] Int. Cl.$^6$ ....................... H04B 1/26
[52] U.S. Cl. .................. 455/326; 455/333; 327/113; 333/119
[58] Field of Search .................. 455/323, 326, 455/327, 330, 292, 332, 333; 333/24 R, 245, 246, 25, 26, 117, 119; 327/113

[56] References Cited

U.S. PATENT DOCUMENTS

| | | |
|---|---|---|
| 4,675,911 | 6/1987 | Sokolov et al. .................. 455/333 |
| 4,979,233 | 12/1990 | Kawahata .................. 455/326 |
| 5,060,298 | 10/1991 | Waugh et al. .................. 455/326 |
| 5,280,648 | 1/1994 | Dobrovolny .................. 455/333 |
| 5,361,409 | 11/1994 | Vice .................. 455/326 |

Primary Examiner—Edward F. Urban
Attorney, Agent, or Firm—R. Michael Ananian; Flehr Hohbach Test Albritton & Herbert LLP

[57] ABSTRACT

Apparatus for reducing intermodulation distortion in a mixer output signal provides for back-to-back serial connected FET transistors joined at gate and source terminals and cancels intermodulation distortion. In one embodiment the apparatus provides first and second FET having their gates tied to one another and their sources tied to one another such that the FETs are connected back-to-back in series and have equal gate-to-source voltages and FET drain-to-source voltage that are equal in magnitude but opposite in sign to the second FET drain-to-source voltage. A control voltage, such as a local oscillator voltage signal is applied between the FET gate terminals and the FET source terminals to switch the conduction state of the serially connected FETs between a conducting state and a non-conducting state. A second signal, such as either an RF or an IF signal, is applied between the drain terminals of the FETs and this second signal passes through a channel combination defined by the serially connected FETs during channel conduction, and thus mixes with the control signal to generate the mixer output signal. Intermodulation distortion is introduced into the output signal by the first and second FET, but the structure and method provide for suppression or substantial cancellation of this intermodulation distortion in the final mixer output signal. Embodiments having a duplicity of serially connected FET pairs are also provided.

20 Claims, 3 Drawing Sheets

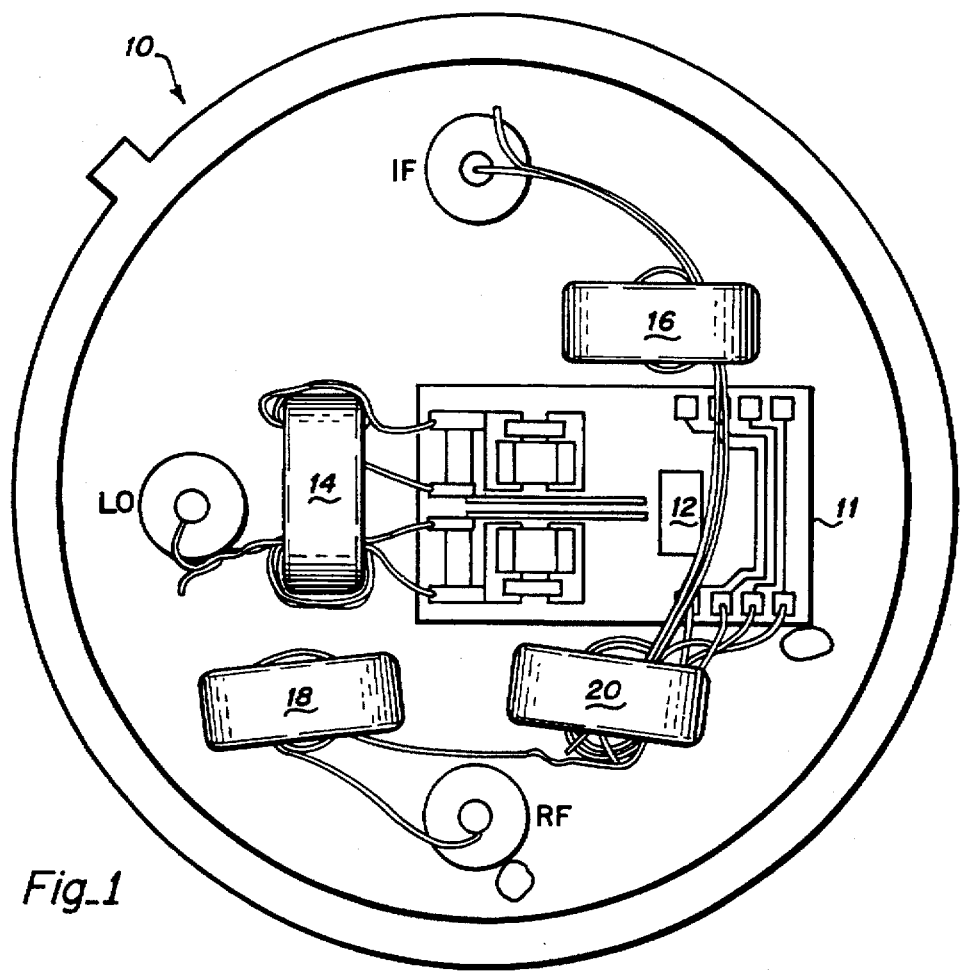
Fig_1
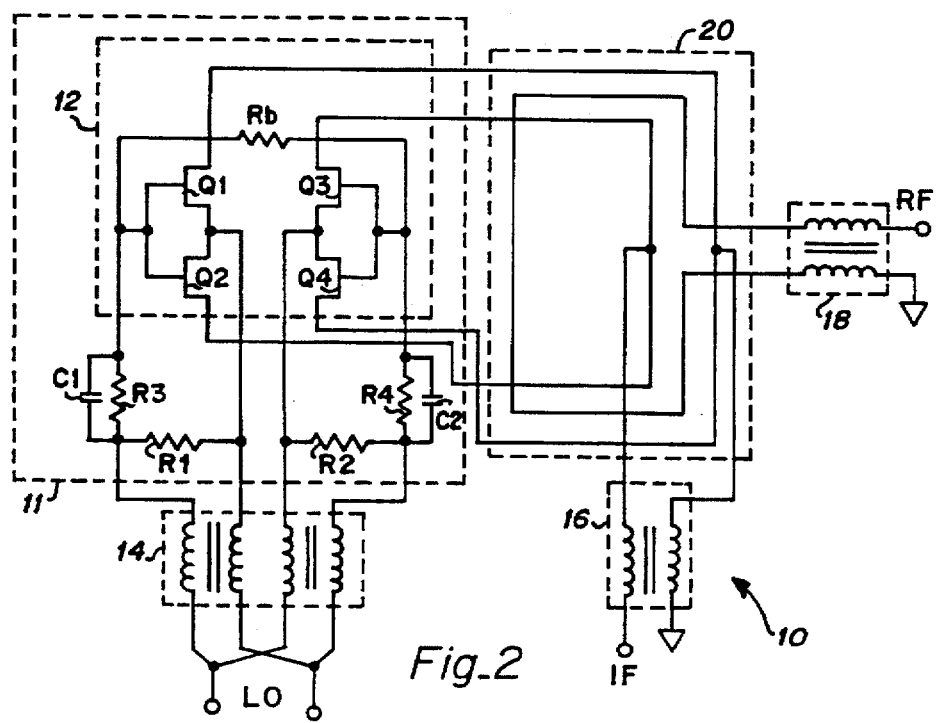
Fig_2

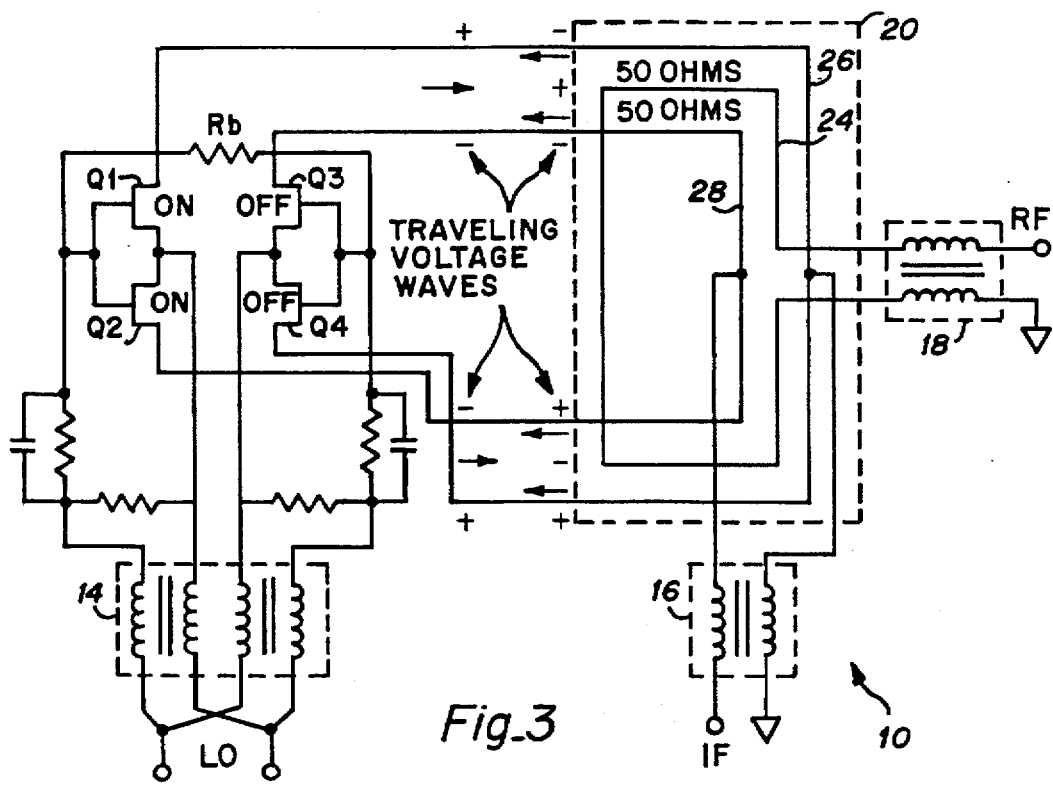
Fig_3
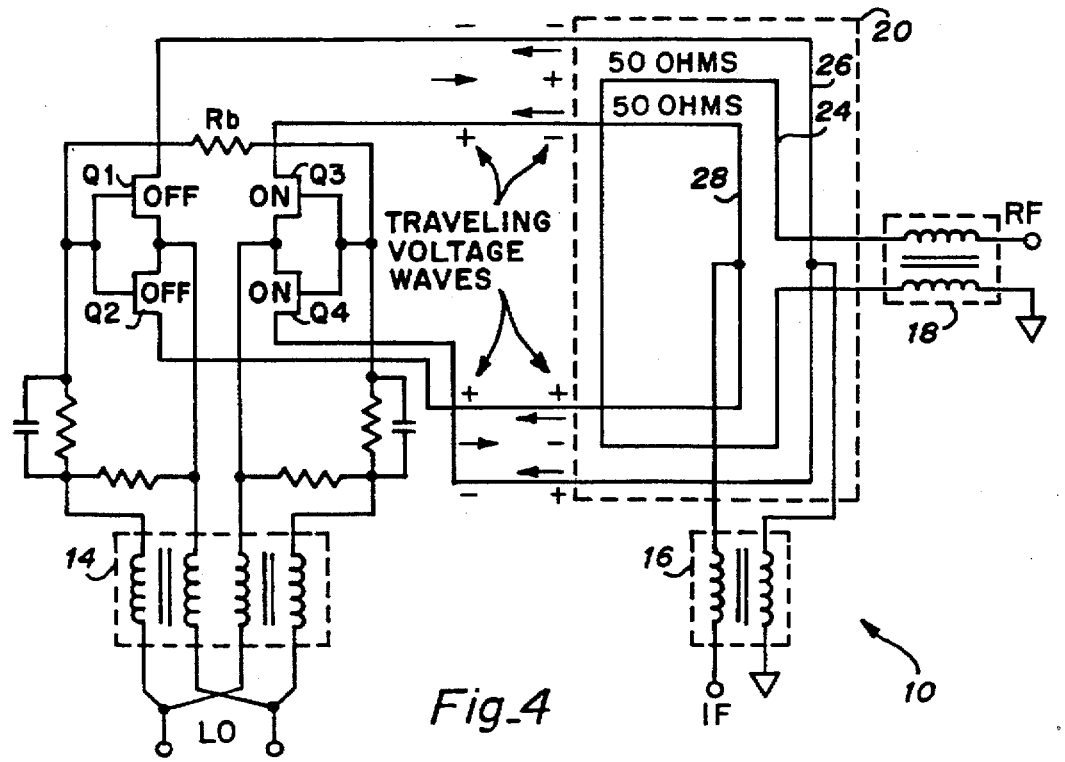
Fig_4

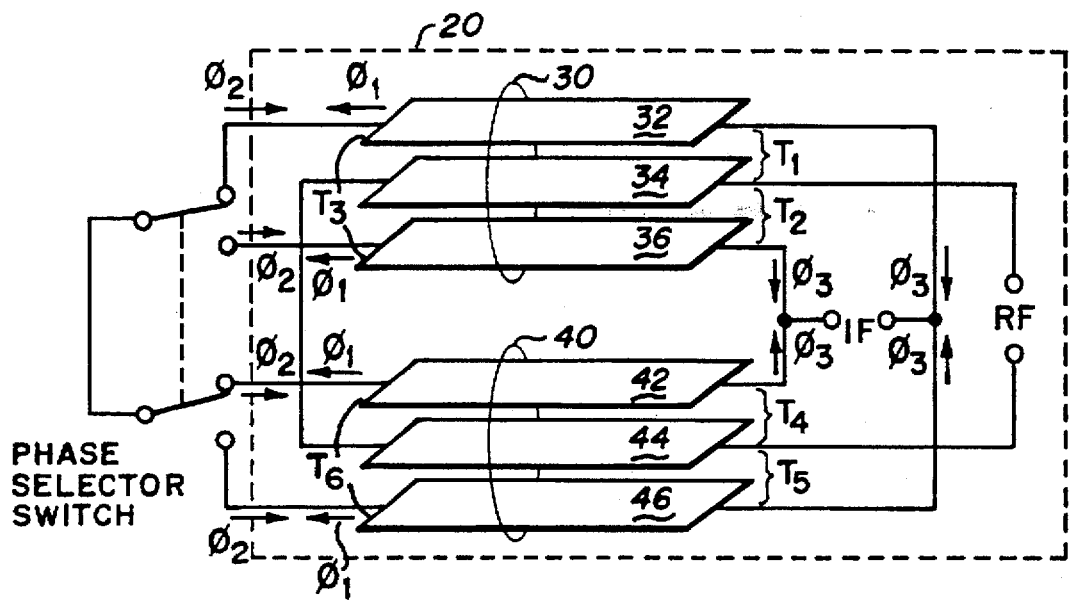
Fig_5
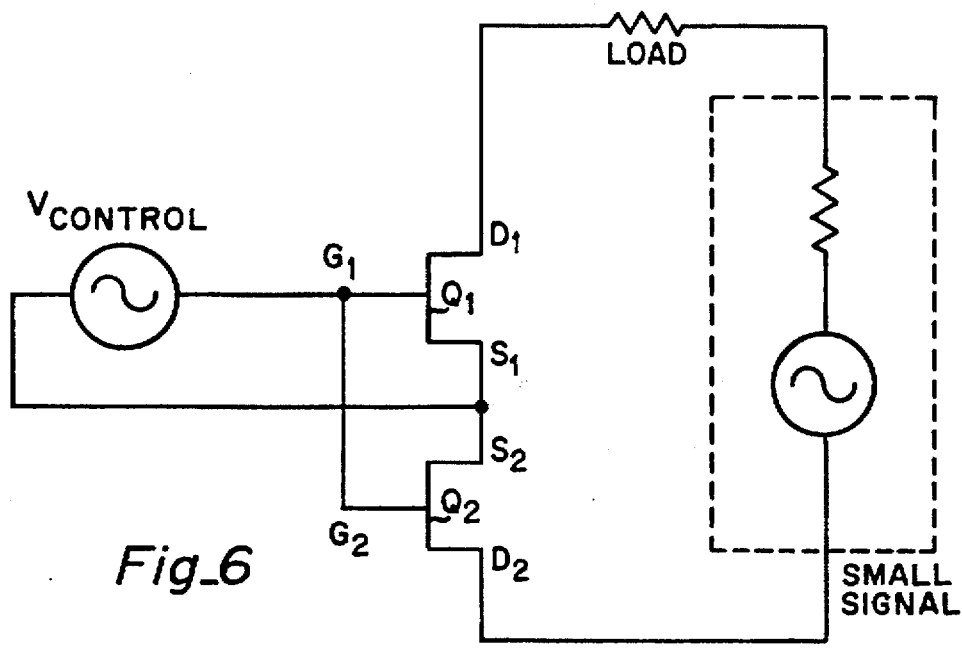
Fig_6

METHOD AND APPARATUS FOR REDUCING INERMODULATION DISTORTION IN A MIXER

This is a divisional of application Ser. No. 08/376,126 filed Jan. 19, 1995, now U.S. Pat. No. 5,551,074; which is a continuation of application Ser. No. 08/105,292 filed Aug. 10, 1993, now abandoned; which is a division of application Ser. No. 08/004,234, filed Jan. 14, 1993, now U.S. Pat. No. 5,361,409; which is a continuation of application Ser. No. 07/668,248, filed Mar. 12, 1991, now abandoned.

BACKGROUND OF THE INVENTION

1. Field of the Invention

The invention relates generally to radio frequency communication devices and more specifically to mixers requiring relatively low local oscillator power levels and having high third order intercepts.

2. Description of the Prior Art

The dynamic range of many prior art microwave frontends is controlled by the single and two-tone intermodulation levels of a Schottky diode mixer. (S. Weiner, D. Neuf, S. Spohrer, "2 to 8 GHZ Double Balanced MESFET Mixer With +30 dBm Input 3rd Order Intercept," 1988 *IEEE MTT-S Digest*, pp.1097–1099.) A typical Schottky mixer obtains third order intercept points approximately equal to the local oscillator (LO) power minus the conversion loss plus 10-dB. The popular diode-ring double-balanced mixer often requires the LO power to exceed the signal compression level by 6-dB. Trade-offs between LO power levels and third order intercept and one dBm compression points are inevitable, even in multiple diode schemes attempting to improve isolation, bandwidth, and single-tone intermodulation levels. Low distortion mixing is known to be possible with small amounts of LO power when an unbiased channel of a GaAs MESFET is used as the mixing element. (See, Stephen A. Maas, "A GaAs MESFET Balanced Mixer With Very Low Intermodulation," 1987 *IEEE MTT-S Digest*, pp.895– 896.) Weiner, et al., describe both single and double balanced mixers that use GaAs MESFETs instead of diodes. These mixers operate over a two to eight GHz range and obtain third order intercepts greater than +28 dBm at an LO power input of +23 dBm, with typical conversion loss of 8-dB, and an LO to radio frequency (RF) isolation greater than 25-dB. Weiner, et al., explain that previous designs using MESFETs had been limited by the LO balun and intermediate frequency (IF) transformer. These limitations were overcome by using a ring of GaAs MESFETs and tapered microstrip baluns in novel single and double balanced configurations to achieve multi-octave bandwidths. However, the bandwidth of these units is limited by the MESFET package parasitic reactances used in the ring. Weiner, et al., indicate that their future experiments will include a monolithic MESFET Quad with special gate geometry designed to improve the third order distortion, and wire-bonding of the FET to an alumina substrate to minimize parasitic reactances.

The Siliconix Si8901-DBM is a monolithic quad-MOSFET ring demodulator/mixer that is reported to achieve third-order intercepts exceeding +37 dBm and 2-dB signal overload compression and desensitization of +30 dBm at a LO drive level of +17 dBm (50 mW). (Ed Oxner, "high dynamic range mixing with the Si8901," ?? March 1988, pp.10–11.) The Si8901 comes in a hermetic TO-99 package and a surface mount SO-14 package. The Si8901 commutation-mixer relies on the switching action of the quad-MOSFET elements to effect a mixing action. The MOSFETs act, essentially, as a pair of switches reversing the phase of a signal at a rate determined by the LO frequency. The MOSFETs exhibit a finite on-resistance that is expressed as a conversion efficiency loss. The loss results from the $r_{ds(on)}$ of the MOSFETs relative to both the signal and IF impedances and signal conversion to unwanted frequencies.

SUMMARY OF THE PRESENT INVENTION

It is therefore an object of the present invention to produce a radio frequency mixer that has a wide dynamic range of operation and low overall signal distortion.

Briefly, a mixer of the present invention comprises four GaAs MESFET transistors in a MMIC, a "reflection" transformer having tri-filar windings, an IF balun, an RF balun, a local oscillator balun, a pair of load resistors, a MESFET bias resistor within the MMIC, and a pair of series capacitors. The mixer is packaged in a TO-8 metal package.

An advantage of the present invention is that an improved dynamic signal range is exhibited.

Another advantage of the present invention is that lower distortion results in the intermediate frequency signal.

Another advantage of the present invention is that the third order two tone intercept point is substantially better than a diode mixer for identical levels of local oscillator drive.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a top elevational view of a mixer of the present invention constructed inside a metal TO-8 transistor package;

FIG. 2 is a schematic diagram of the mixer of FIG. 1;

FIG. 3 is a schematic diagram of the traveling waves incident to and reflected from the MMIC in a first state;

FIG. 4 is a schematic diagram of the traveling waves incident to and reflected from the MMIC in a second state opposite to the first;

FIG. 5 is a schematic diagram of the reflection transformer and emphasizes the transmission line segment nature of the trifilar windings; and FIG. 6 is a schematic of a pair of back-to-back FETs used as a model to explain how the present invention reduces intermodulation distortion in the preferred embodiment.

DETAILED DESCRIPTION OF THE PREFERRED EMBODIMENTS

FIG. 1 illustrates a mixer of the present invention, referred to by the general reference numeral 10, comprising a substrate 11 having a MMIC 12, a local oscillator (LO) balun 14, an intermediate frequency (IF) balun 16, a radio frequency (RF) balun 18, and a reflection transformer 20 all mounted in an industry standard TO-8 transistor "flat pack" hermetic Kovar package. Transformer 20 is referred to as a "reflection transformer," and such a term is new to the art. A reflection transformer is defined herein to mean any transmission line transformer that relies on a nearly complete reflection of energy at some reference plane of the transformer to achieve substantially complete coupling between its two or more distinct terminals or ports.

Referring to FIG. 2, substrate 11 comprises two 100Ω thick film resistors labelled R1 and R2, two capacitors C1 and C2, and two 500Ω resistors R3 and R4. MMIC 12 comprises four GaAs MESFET transistors Q1, Q2, Q3, and Q4, and preferably has a 5KΩ resistor Rb connected between the gates of Q1 and Q2 and the gates of Q3 and Q4. Resistors R3 and R4 are intended to aid in the development of an optimum DC bias on the gates of transistors Q1, Q2, Q3, and Q4. If resistor Rb is included in MMIC 12, resistors R3 and R4 can be eliminated. A DC bias voltage will self-develop in transistors Q1, Q2, Q3, and Q4 by virtue of a small, but significant, amount of intentional forward-biased gate current.

FIGS. 3 and 4 illustrate the switching action of transistors Q1, Q2, Q3, and Q4 in response to a LO signal input. LO balun 14 will present a 50Ω impedance to the LO because resistors R1 and R2 are seen in parallel and represent the principal components of the input impedance. LO balun 14 is wound such that the LO signal is 180° out of phase between the gates of Q1 and Q2 and the gates of Q3 and Q4. Transistors Q1, Q2, Q3, and Q4 do not operate in their linear regions for any significant time and will either be fully ON or fully OFF. FIG. 3 illustrates when Q1 and Q2 are ON and Q3 and Q4 are OFF. FIG. 4 illustrates the opposite condition when Q1 and Q2 are OFF and Q3 and Q4 are ON. Either way, transistors Q1, Q2, Q3, and Q4 will not present a 50Ω impedance to reflection transformer 20. Incoming RF signals from RF balun 18 will cause a winding 24 to induce a signal into a pair of windings 26 and 28. These signals travel out reflection transformer on both top and bottom branches of windings 26 and 28 to transistors Q1, Q2, Q3, and Q4, where they then reflect back to the mid-point where IF balun 16 taps into reflection transformer 20. The nature of the signals seen by IF balun 16 will depend on whether transistor pair Q1 and Q2 are ON or transistor pair Q3 and Q4 are ON. (If Q1 and Q2 are ON, Q3 and Q4 must be OFF, and vice versa.) The LO input signal is therefore caused to beat against the RF input signal with the products (RF, LO, RF−LO, and RF+LO) appearing as the IF output signal. (The RF and LO product terms are considerably suppressed by virtue of the balanced topology and are therefore insignificant.) Mixer 10 has a very high third-order two-tone intercept point. (Those skilled in the art will be familiar with the use of the third-order two-tone intercept point as a measure of a figure of merit for a mixer.)

FIG. 5 illustrates a conceptual view of the reflection transformer 20 as comprising six transmission line segments $T_1-T_6$. A trifilar wire 30 comprises three individual wires 32, 34, and 36. Transmission line segment $T_1$ is comprised of wires 32 and 34, and transmission line segment $T_2$ is comprised of wires 34 and 36. Wires 32 and 36 comprise transmission line segment $T_3$. A trifilar wire 40 comprises three individual wires 42, 44, and 46. Transmission line segment T4 is comprised of wires 42 and 44, and transmission line segment $T_5$ is comprised of wires 44 and 46. Wires 42 and 46 comprise transmission line segment $T_6$. For purposes of explanation only, a phase selector switch in FIG. 5 replaces the quad-MESFET of FIGS. 2–4 at a phase switching port of transformer 20. The input signals are applied at an RF port and output is taken at an IF port. (The labels "RF port" and "IF port" owe their relevance to the mixer application of the reflection transformer and can alternatively be replaced by the labels "primary port" and "secondary port," respectively.) The several transmission lines $T_1-T_6$ behave in the manner shown in Table I.

TABLE I

| T | Z | $\phi_1$ | $\phi_2$ | $\phi_3$ |
|---|---|---|---|---|
| $T_1$ | $Z_0$ | 0° | 180° | 180° |
| $T_2$ | $Z_0$ | 0° | 0° | 0° |
| $T_3$ | $2Z_0$ | | | |
| $T_4$ | $Z_0$ | 180° | 180° | 0° |
| $T_5$ | $Z_0$ | 180° | 0° | 180° |
| $T_6$ | $2Z_0$ | | | |

Each transmission line $T_1-T_6$ has a characteristic impedance equal to the system impedance of $Z_0$ (preferably 50Ω) or equal to two times $Z_0$. The combined parallel impedance of $T_1$ and $T_2$ (and also $T_4$ ands $T_5$) is $Z_0/2$, which is the correct impedance for an ordinary balanced transformer of this type. The combined series impedance of these lines is $2Z_0$, which gives $Z_0$ when combined at the IF port. Thus, the transformer is matched to a system impedance of $Z_0$ at both the RF and IF ports. The incident wave relative phase angle at the phase switching port is represented by $\phi_1$ and is expressed in degrees. The reflected wave relative phase angle at the phase switching port is represented by $\phi_2$ and is expressed in degrees. The resultant relative phase angle at the IF output port is represented by $\phi_3$ and is also expressed in degrees.

FIG. 6 illustrates how back-to-back FETs help cancel intermodulation distortion. For the circuit of FIG. 6:

$$V_{g_1s_1} = V_{control}$$

$$V_{g_2s_2} = V_{control}$$

$$V_{g_1d_1} = V_{g_1s_1} + V_{s_1d_1}$$

$$V_{g_2d_2} = V_{g_2s_2} + V_{s_2d_2}$$

To a first approximation, $V_{s_1d_1} = -V_{s_2d_2}$. Also, to a first approximation, $\Delta R_{ds} = c \, \Delta V_{gd}$, which says that the channel resistance is linear to gate bias. This assumption is nearly correct during the time that the FETs are heavily conductive.

Let $Rd_1d_2$ be the total series resistance of the FETs, and $\Delta Rd_1d_2$ be that component of the channel resistance causing intermodulation distortion. Then, $$\begin{aligned}\Delta Rd_1d_2 &= c(\Delta V_{g_1d_1} + \Delta V_{g_2d_2}) \\ &= c(V_{s_1d_1} + V_{s_2d_2}) \\ &= 0\end{aligned}$$

The small signal passes through the FET channel combination without controlling its resistance. This condition is equivalent to infinite intermodulation suppression. This is the technique used in mixer 10 to help reduce intermodulation distortion.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. In a mixer, an apparatus for reducing intermodulation distortion in art output signal, said apparatus comprising:

a first and a second FET each having a gate and a drain and a source, the first and second FET having their gates tied to one another and their sources tied to one another such that said first and second FETs are connected back-to-back in series and have substantially equal gate-to-source voltages at all times, said first FET drain-to-source voltage being substantially equal in magnitude but opposite in sign to said second FET drain-to-source voltage at all times;

means for applying a control voltage signal between said tied first and second FET gate terminals and said tied first and second FET source terminals, said control voltage signal operable to switch the conduction state of said serially connected FETs between a conducting state and a non-conducting state; and means for coupling a second signal between the drain terminals of said first and second FETs, said second signal passing through a channel combination defined by said serially connected first and send FET during the time said FETs are conducting and mixing with said control voltage signal to generate said output signal;

said first FET introducing a first component of intermodulation distortion in said output signal related to the change in channel resistance of said first FET during channel conduction, and said second FET introducing a second component of intermodulation distortion in said output signal related to the change in channel resistance of said second FET during channel conduction, said second component being substantially equal in magnitude but opposite in sign to said first component;

said back-to-back serial FET connection providing means for summing said first distortion component and said second distortion component to substantially cancel said first distortion component by said second distortion component at all times so that the overall intermodulation distortion introduced in said mixer output signal is suppressed.

2. The apparatus in claim 1, further comprising means for coupling a d.c. gate bias voltage to said gates of said first and second FETs.

3. The apparatus in claim 1, wherein said voltage control signal is a local oscillator (LO) signal, said second signal is a radio-frequency (RF) signal, and said output signal is an intermediate frequency (IF) signal.

4. The apparatus in claim 1, wherein said voltage control signal is a local oscillator (LO) signal, said second signal is an intermediate-frequency (IF) signal, and said output signal is a radio-frequency (RF) signal.

5. The apparatus in claim 1, wherein said first and second FETs each comprise a GaAs MESFET.

6. The apparatus in claim 1, wherein said fist and second FETs have precisely equal gate-to-source voltages at all times, and wherein said first FET drain-to-source voltage is equal in magnitude but opposite in sign to said second FET drain-to-source voltage at all times; and said serial FET connection summing said fit distortion component and said second distortion component to completely cancel said first distortion component by said second distortion component at all times so that the overall intermodulation distortion introduced in said mixer output signal is substantially eliminated.

7. The apparatus in claim 1, wherein said means for applying a control voltage signal between said FET gate terminals and said FET source terminals comprises means for applying a control signal having first and second control signal components, said first control signal component having a first signal amplitude characteristic being applied to said FET gate terminals, and a second control signal component having the same signal amplitude characteristic and a 180-degree shifted phase characteristic relative to said first control signal component.

8. The apparatus in claim 7, whrein said FET gates are driven at a first phase of said switching signal; and wherein said FET sources are driven at second phase of said switching signal, said second phase being shifted by 180-degrees relative to said first phase.

9. The apparatus in claim 1, whrein said FET gates are driven at a first phase of said control signal voltage; and wherein said FET sources are driven at second phase of said control voltage signal, said second phase being shifted by 180-degrees relative to said first phase.

10. The apparatus in claim 1, wherein said voltage control signal is a local oscillator (LO) signal;

said means for applying a control voltage signal between said FET gate terminals and said FET source terminals comprises means for applying a control signal having first and second control signal components, said first control signal component having a first signal amplitude characteristic being applied to said FET gate terminals, and a second control signal component having the same signal amplitude characteristic and a 180-degree shifted phase characteristic relative to said first control signal component; and said first and second FETs have precisely equal gate-to-source voltages at all times, and wherein said first FET drain-to-source voltage is equal in magnitude but opposite in sign to said second FET drain-to-source voltage at all times; and said serial FET connection summing said first distortion component and said second distortion component to substantially cancel said first distortion component by said second distortion component at all times so that the overall intermodulation distortion introduced in said mixer output signal is substantially eliminated; and further comprising:

a third and a fourth FET each having a gate and a drain and a source, said third and fourth FETs having their gates tied to one another and their sources tied to one another such that said third and fourth FETs are connected source-to-source in series and have substantially equal gate-to-source voltages at all times and have substantially equal magnitude but opposite sign drain-to-source voltages at all times; and said local oscillator signal being coupled to said third and fourth FETs between said third and fourth FET joined gate terminals and said third and fourth FET joined source terminals to switch the conduction state of said serially connected third and fourth FETs between a conducting state and a non-conducting state such that said third and fourth FETs are driven off and on opposite to said first and second FETs.

11. The apparatus in claim 1, wherein said means for summing said first distortion component and said second distortion component to substantially cancel said first distortion component by said send distortion component includes means for completely cancelling said first distortion component by said second distortion component at all times so that the overall intermodulation distortion introduced in said mixer output signal is at least substantially eliminated.

12. A signal mixing device for generating a mixer output signal comprising:

a first and a second FET each having a gate and a drain and a source, said first and second FETs having their gates tied to one another and their sources tied to one another such that said first and second FETs are connected source-to-source in series and have substantially equal gate-to-source voltages at all times and have substantially equal magnitude but opposite sign drain-to-source voltages at all times;

a first input port for receiving a local oscillator signal and for coupling said local oscillator signal between said joined gate terminals and said joined source terminals to switch the conduction state of said serially connected FETs between a conducting state and a non-conducting state;

a second port for receiving a second signal and for coupling said second signal between said drain terminals of said first and second FETs, said second signal passing through the channel combination formed by said first and second FETs during the time said FETs are conducting, said second signal mixing with said local oscillator signal in said channel combination to generate said output signal;

said first FET introducing a first component of intermodulation distortion in said output signal related to the change in channel resistance of said first FET during channel conduction, and said second FET introducing a second component of intermodulation distortion in said output signal related to the change in channel resistance of said second FET during channel conduction, said second component being about equal in magnitude but opposite in sign to said first component; said back-to-back serial FET connection being operative to sum and substantially cancel said first distortion component with said second distortion component so that the overall intermodulation distortion introduced in said mixer output signal is suppressed; and an output port for extracting said output signal.

13. The signal mixing device in claim 12, further comprising:

a third and a fourth FET each having a gate and a drain and a source, said third and fourth FETs having their gates tied to one another and their sources tied to one another such that said third and fourth FETs are connected source-to-source in series and have substantially equal gate-to-souce voltages at all times and have substantially equal magnitude but opposite sign drain-to-source voltages at all times; and said local oscillator signal being coupled to said third and fourth FETs between said third and fourth FET joined gate terminals and said third and fourth FET joined source terminals to switch the conduction state of said serially connected third and fourth FETs between a conducting state and a non-conducting state such that said third and fourth FETs are driven off and on opposite to said first and second FETs.

14. The signal mixing device in claim 12, wherein said back-to-back serial FET connection being operative to sum and completely cancel said first distortion component with said second distortion component so that the intermodulation distortion introduced in said mixer output signal by said first and said second distortion components are substantially eliminated.

15. A method for reducing intermodulation distortion in a mixer output signal, said method comprising the steps of:

providing a fist and a second FET each having a gate and a drain and a source terminal;

joining said first and second FET gates to one another and said first and second FET source to one another such that said first and second FETs are connected back-to-back in series and have substantially equal gate-to-source voltages and substantially equal magnitude but opposite sign drain-to-source voltages at all times during operation;

applying a control voltage signal between said joined gate terminals and said joined source terminals, said control voltage signal operable to switch the conduction state of said serially connected FETs between a conducting state and a non-conducting state;

mixing said control voltage signal with a second signal coupled between the drain terminals of said first and second FETs, said second signal passing through said first and second FET channel combination during the time said FETs are conducting, said second signal mixing with said control voltage signal in said channel combination to generate said output signal; and substantially canceling a first component of intermodulation distortion introduced into said output signal by said first FET related to the change in channel resistance of said first FET, with a second component of intermodulation distortion introduced into said output signal by said second FET related to the change in channel resistance of said second FET, said second component of distortion being about equal in magnitude but opposite in sign to said first component at all times.

16. The method in claim 15, wherein said control voltage signal comprises a local oscillator signal.

17. The method in claim 15, wherein said second voltage signal comprises an RF signal.

18. The method in claim 15, wherein said second voltage signal comprises an IF signal.

19. A method for reducing intermodulation distortion in a mixer output signal, said method comprising the steps of:

applying a switching signal between serially connected first and second FETs having joined gates and joined sources to switch a channel defined by said joined FET pair between conducting and non-conducting state;

applying a second signal between said first and second FET drains so that said second signal passes through a combination channel defined by said serially joined FETs and mixes with said switching signal to generate an output signal;

suppressing intermodulation distortion by summing an intermodulation distortion component introduced into said mixed signal by said first FET with an equal magnitude but opposite sign intermodulation distortion component introduced by said second FET; and extracting a mixer output signal substantially free from intermodulation distortion.

20. The method in claim 19, wherein said first distortion component is an even order distortion component generated in said first FET, and said second distortion component is an even order distortion generated in said second FET; and wherein said step of suppressing intermodulation distortion by summing an intermodulation distortion component introduced into said mixed signal by said first FET with an equal magnitude but opposite sign intermodulation distortion component introduced by said second FET comprises summing said first and second even order distortion components to substantially eliminate intermodulation distortion in said mixer output signal arising from said first and second even order distortion components.

* * * * *

UNITED STATES PATENT AND TRADEMARK OFFICE
CERTIFICATE OF CORRECTION

PATENT NO. : 5,752,181
DATED : May 12, 1998
INVENTOR(S) : Vice, Michael W.

It is certified that error appears in the above-indentified patent and that said Letters Patent is hereby corrected as shown below:

On the title page, and col. 1, line 2,
Item [54] in the title, after "REDUCING" delete "INERMODULATION"

and insert --INTERMODULATION--

Signed and Sealed this

Twentieth Day of April, 1999

Q. TODD DICKINSON

*Attest:*

*Attesting Officer*      Acting Commissioner of Patents and Trademarks